US008026526B2

(12) United States Patent
Weber-Rabsilber et al.

(10) Patent No.: US 8,026,526 B2
(45) Date of Patent: Sep. 27, 2011

(54) OPTOELECTRONIC SEMICONDUCTOR COMPONENT

(75) Inventors: Sven Weber-Rabsilber, Neutraubling (DE); Stefan Gruber, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 18 days.

(21) Appl. No.: 12/478,517

(22) Filed: Jun. 4, 2009

(65) Prior Publication Data

US 2009/0267107 A1 Oct. 29, 2009

Related U.S. Application Data

(63) Continuation of application No. PCT/DE2007/002091, filed on Nov. 16, 2007.

(30) Foreign Application Priority Data

Dec. 19, 2006 (DE) ......................... 10 2006 059 994

(51) Int. Cl.
*H01L 33/00* (2010.01)

(52) U.S. Cl. .............. 257/95; 257/99; 257/100; 257/98; 257/E33.066; 257/E33.067

(58) Field of Classification Search ..................... 257/95
See application file for complete search history.

(56) References Cited

U.S. PATENT DOCUMENTS

| | | | | |
|---|---|---|---|---|
| 4,686,764 | A * | 8/1987 | Adams et al. | 29/592.1 |
| 5,137,844 | A | 8/1992 | Chiulli | |
| 6,340,824 | B1 | 1/2002 | Komoto et al. | |
| 6,345,903 | B1 | 2/2002 | Koike et al. | |
| 2002/0079506 | A1* | 6/2002 | Komoto et al. | 257/99 |
| 2003/0168720 | A1 | 9/2003 | Kamada | |
| 2003/0211804 | A1 | 11/2003 | Sorg | |
| 2004/0046222 | A1* | 3/2004 | Nagai et al. | 257/433 |
| 2004/0080264 | A1 | 4/2004 | Ichikawa | |
| 2006/0234409 | A1 | 10/2006 | Nagai et al. | |

FOREIGN PATENT DOCUMENTS

| | | |
|---|---|---|
| EP | 1 174 931 A2 | 1/2002 |
| EP | 1 592 074 A2 | 11/2005 |

OTHER PUBLICATIONS

Moellmer, F., et al., "Siemens-SMT-TOP-LED—LEDs for Surface Mounting," Part 1: Characteristics and special features, Siemens Components XXVI ,1991, pp. 147-149.

* cited by examiner

*Primary Examiner* — Jarrett J Stark
*Assistant Examiner* — Lawrence Tynes, Jr.
(74) *Attorney, Agent, or Firm* — Slater & Matsil, L.L.P.

(57) ABSTRACT

An optoelectronic semiconductor component includes a basic body, at least one semiconductor chip arranged thereon, and an encapsulation embedding the at least one semiconductor chip and composed of a radiation-transmissive material with scattering particles. A radiation-transmissive covering layer with an absorber is applied to the encapsulation.

14 Claims, 2 Drawing Sheets

11
10
3
4
5
6
10
1
2
2B
2A
1

4
5
6
7
2A
3
2B 4
5
6
7
2A
3
2B

OPTOELECTRONIC SEMICONDUCTOR COMPONENT

This application is a continuation of co-pending International Application No. PCT/DE2007/002091, filed Nov. 16, 2007, which designated the United States and was not published in English, and which claims priority to German Application No. 10 2006 059 994.2 filed Dec. 19, 2006, both of which applications are incorporated herein by reference.

TECHNICAL FIELD

The invention relates to an optoelectronic semiconductor component comprising a basic body, at least one semiconductor chip arranged thereon, and an encapsulation embedding the at least one semiconductor chip and composed of a radiation-transmissive material with scattering particles.

BACKGROUND

Optoelectronic semiconductor components are used, for example, in an area of display technology where a homogeneously illuminated and high-contrast image is important.

A production method for conventional optoelectronic semiconductor components of the type mentioned involves firstly injection-molding a suitable plastic material around a prefabricated leadframe, the material forming a basic body for the housing of the device. The basic body has a cutout at the top side, connections of the leadframe being led into the cutout from two opposite sides. On one connection, the semiconductor chip, for example, an LED chip or a laser diode, is adhesively bonded and electrically contact-connected. A generally radiation-transmissive potting compound is then filled into the cutout and embeds the semiconductor body. This basic form of a surface-mountable optoelectronic semiconductor component is known, for example, from the article "SIEMENS SMT-TOPLED für die Oberflächenmontage", ["SIEMENS SMT-TOPLED for surface mounting"], F. Möllmer und G. Waitl, Siemens Components 29 (1991), Issue 4, pages 147-149.

In order to generate, in a video display, for example, an image that is illuminated as homogeneously as possible and has the highest possible contrast, the light sources used are optoelectronic semiconductor components whose basic bodies are entirely diffusely reflective, that is to say they appear white, or basic bodies whose edge region is printed dark, and the rest of the basic body remains white. A dark embodiment of the basic body of the semiconductor components results in the generation of a high-contrast image. The contrast can be reduced by incidence of extraneous light, since the extraneous light is reflected at the emission area of the semiconductor component and the chip surface. By way of example, the contrast decreases as the brightness of the ambient light increases and the displayed image appears bleached out.

If the potting compound of the semiconductor components also contains scattering particles, then the emission area is diffusely reflective. The contrast and the homogeneity of the image can be optimized further by the use of screen devices and/or diffuser plates disposed upstream of the optoelectronic semiconductor components. However, these devices also lead to a loss of light, such that the light emitted by the semiconductor chip must have a higher brightness.

SUMMARY

In one aspect, the invention specifies an optoelectronic semiconductor component, such that the light emitted by the semiconductor chip appears as a homogeneous luminous area and the semiconductor component enables a high-contrast image.

For example, an optoelectronic semiconductor component of the type mentioned in the introduction can be characterized in that a radiation-transmissive covering layer with an absorber is applied to the encapsulation.

The optoelectronic semiconductor components according to the invention generate a homogeneously illuminated and high-contrast image on a video display, wherein the individual pixels appear homogeneously illuminated over the entire pixel area available to them, that is to say not as a small spot generated by the semiconductor chip. The edge regions or dimmed-down or switched-off regions of the image also appear black. By virtue of the application of the radiation-transmissive covering layer with the absorber, the proportion of incident extraneous light is minimized and, as a result, the high-contrast image is generated even as the ambient light brightness increases. By virtue of the scattering particles in the radiation-transmissive material of the encapsulation, the light emitted by the semiconductor chip appears as a homogeneous large luminous area.

By virtue of the separation into two layers, namely the encapsulation containing scattering particles and the covering layer containing absorber that is applied to the encapsulation, a scattering particle density in the encapsulation has no influence on the absorption effect of the covering layer. The advantage is that the proportion of absorber in the covering layer, as the scattering particle density increases, does not have to be increased in order to obtain the same contrast. The absorption loss of the emitted light is therefore kept low. A further advantage is that in the case of an increased contrast, the brightness of the emitted light remains the same. That is to say that the requirements made of the brightness of the optoelectronic semiconductor component in the case of increased contrast are therefore reduced. Furthermore, contrast-enhancing elements disposed upstream of the semiconductor components can be obviated, for example a frame for screening against incident ambient light.

In a further advantageous embodiment, the basic body is produced from a material which is at least partly absorbent for a radiation emitted by the semiconductor chip. The basic body is produced, for example, from a dark or black plastic. This results in a good contrast between the emission area of the component and the rest of the device area.

Further advantageous configurations of the invention are specified in the subclaims.

BRIEF DESCRIPTIONS OF THE DRAWINGS

The invention is explained in more detail below on the basis of exemplary embodiments. In the figures.

DETAILED DESCRIPTION

Figure 1:
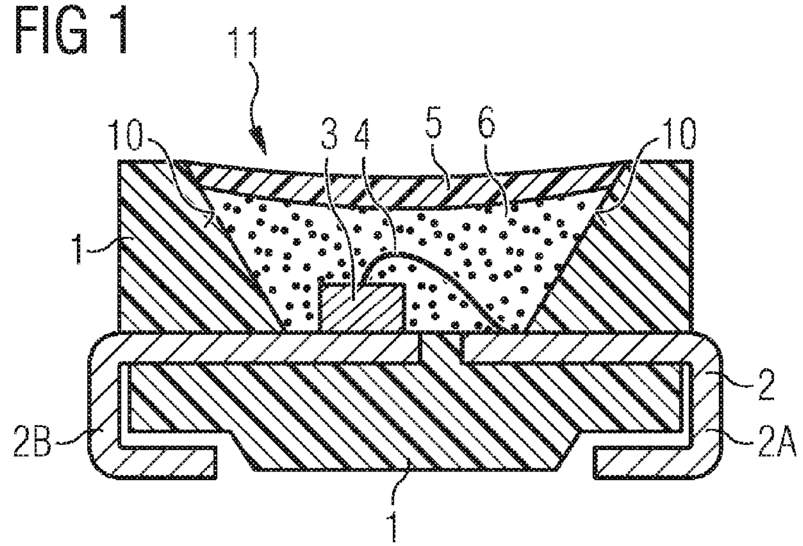
FIG. 1 shows a schematic cross-sectional illustration of a first exemplary embodiment.
Figure 2:
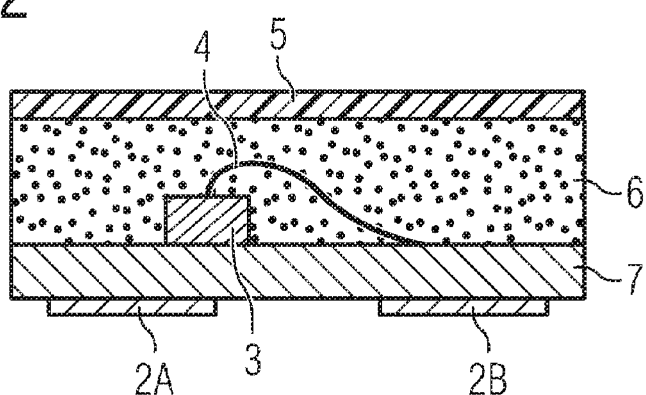
FIG. 2 shows a schematic cross-sectional illustration of a second exemplary embodiment.
Figure 3:
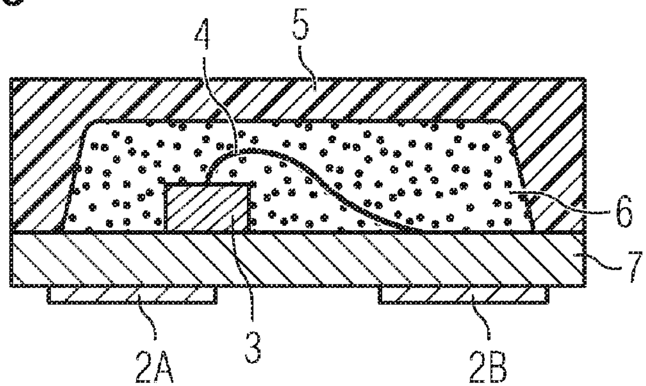
FIG. 3 shows a schematic cross-sectional illustration of a third exemplary embodiment.

FIGS. 1 to 3 show exemplary embodiments of an optoelectronic semiconductor component using surface mounting technology (SMT), wherein identical parts of the semiconductor component are identified by the same reference symbols in the figures.

FIG. 1 shows a schematic cross-sectional view of an optoelectronic semiconductor component in accordance with a first exemplary embodiment of the present invention.

The basic body 1 for the semiconductor component is formed by injection-molding a suitable plastic material around a leadframe 2 to form a housing. The basic body 1 has a central cutout, in which a semiconductor chip 3 such as, for example, an optoelectronic transmitter or receiver is arranged and is electrically conductively connected to the electrical connections 2A, 2B of the leadframe 2 by means of bonding wire technology 4.

An inner area 10 of the cutout of the basic body 1 is embodied in oblique fashion and produced from a black plastic. This results in a good contrast between an emission area 11 of the component and the rest of the device area of the basic body 1. By way of example, a plastic material, preferably a thermoplastic or thermosetting plastic, is used for the basic body 1.

The semiconductor chip 3 is embedded in a radiation-transmissive encapsulation 6, which is produced from a potting compound with scattering particles. In this exemplary embodiment, the filling level of the encapsulation 6 terminates below the surface of the basic body 1. However, it is pointed out that in the context of the present invention, other filling levels of the encapsulation 6 in the cutout of the basic body 1 can also be chosen, of course, as necessary. Two of such exemplary embodiments are shown in FIGS. 1A and 1B.

A covering layer 5 with absorber, which is a radiation-transmissive potting compound with absorber, is applied over the radiation-transmissive encapsulation 6 with scattering particles. In this exemplary embodiment, the filling level of the covering layer 5 terminates with the surface of the basic body 1. The absorber in the covering layer 5 absorbs externally incident extraneous light and thus prevents a reduction of a contrast due to reflection of the extraneous light at the emission area 11 or the chip surface. It is also possible to adhesively bond the covering layer 5 as lamina onto the encapsulation 6.

By way of example, an epoxy resin or silicone is used as material for the potting compound of the encapsulation 6 and the covering layer 5. The scattering particles in the encapsulation 6 are an aluminum oxide, for example. Carbon black, for example, is used as an absorber in the covering layer 5.

Figure 1A:
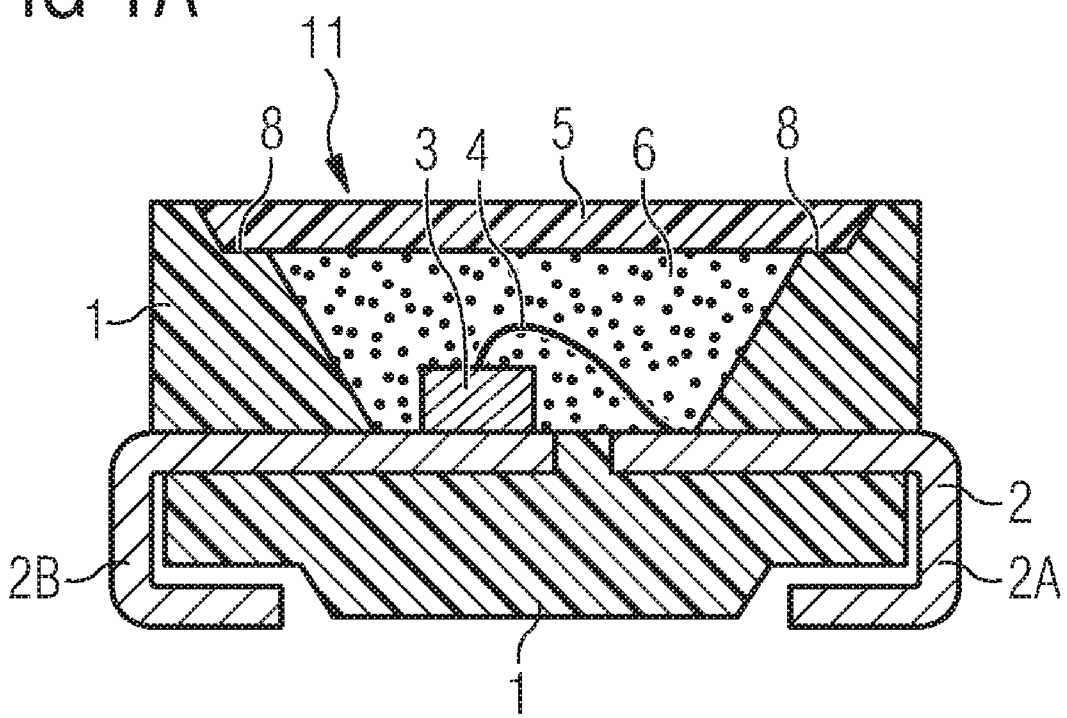
FIGS. 1A and 1B show other embodiments of the invention.
Figure 1B:
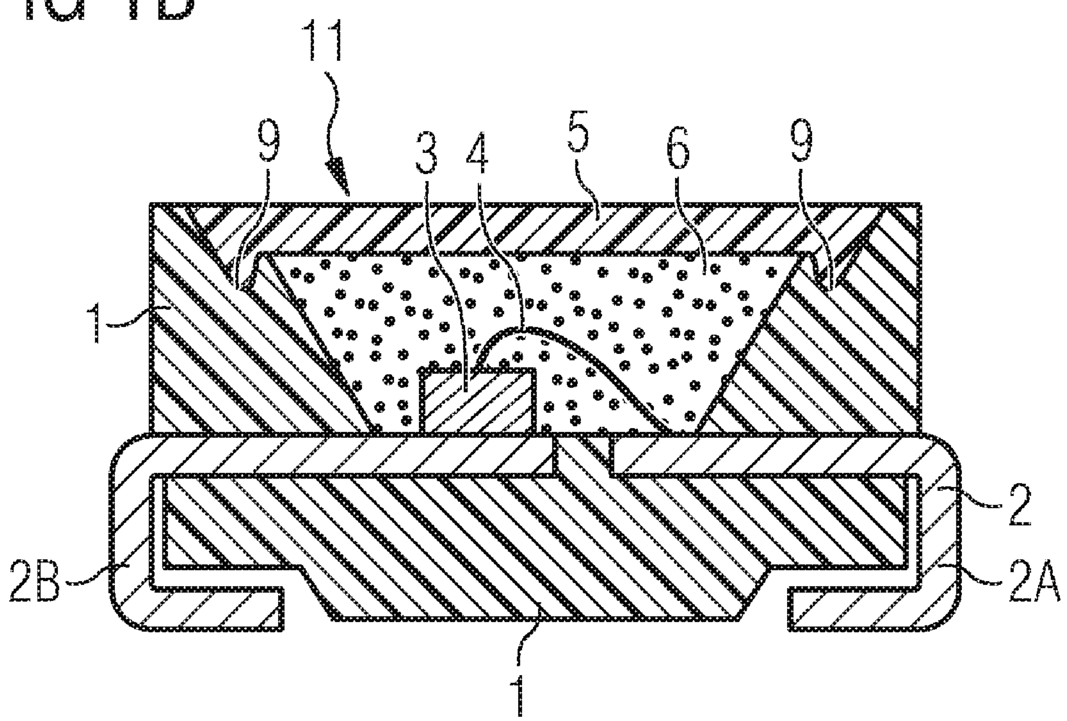

FIG. 1A shows an exemplary embodiment wherein the filling level of the encapsulation 6 in the cutout of the basic body 1 terminates with a step 8 in the inner area 10. The filling level of the covering layer 5 applied to the encapsulation 6 terminates with the surface of the basic body 1. The horizontal extent of the covering layer 5 is greater than the horizontal area of the encapsulation 6 that terminates at the step.

FIG. 1B shows an exemplary embodiment wherein the filling level of the encapsulation 6 in the cutout of the basic body 1 terminates with a wave 9 in the inner area 10. The filling level of the covering layer 5 applied to the encapsulation 6 terminates with the surface of the basic body 1. The horizontal extent of the covering layer is greater than the horizontal area of the encapsulation 6 that terminates at the wave 9. In the vertical direction, the filling level begins in an edge region of the covering layer 5 below the encapsulation 6.

FIG. 2 shows in a second exemplary embodiment a schematic cross-sectional illustration of an optoelectronic semiconductor component whose basic body 1 is formed by a substrate 7.

The semiconductor chip 3 is arranged on the substrate 7 and embedded in a two-layered body, namely the encapsulation 6 with scattering particles and, applied thereto, the covering layer 5 with absorber. The two-layered body is cast or injection-molded onto the substrate 7, the covering layer 5 being cast or injection-molded onto the encapsulation 6.

The encapsulation 6 and the covering layer 5 are produced from epoxy resin, silicone or silicone-epoxide hybrid. The substrate 7 is produced from ceramic or epoxy resin with glass fiber fabric, also known by the abbreviation FR4. The scattering particles in the encapsulation 6 are an aluminum oxide, for example. Carbon black, for example, is used as absorber in the covering layer 5.

It is also possible to print or adhesively bond the covering layer 5 as lamina onto the encapsulation 6.

It is possible to adhesively bond the covering layer 5 over the encapsulations 6 of a plurality of semiconductor components and separate them from one another together with the semiconductor components. It is also possible to print the covering layer 5 onto the encapsulations 6 of a plurality of semiconductor components. However, the encapsulations 6 must then form a planar area.

FIG. 3 shows in a third exemplary embodiment a schematic cross-sectional illustration of an optoelectronic semiconductor component whose basic body 1 is also formed by the substrate 7.

The semiconductor chip 3 is arranged on the substrate 7 and the semiconductor chip 3 is embedded in the two-layered body, namely the encapsulation 6 with scattering particles and, applied thereto, the covering layer 5 with absorber.

The covering layer 5 is cast or injection-molded onto the encapsulation 6. In this case, the covering layer 5 with absorber encapsulates the encapsulation 6 with scattering particles, wherein the filling level of the covering layer 5 reaches as far as the substrate 7 in this exemplary embodiment. Extraneous light incident into the semiconductor component is screened particularly effectively, wherein the brightness of the light emitted by the semiconductor chip does not have to be increased.

It is pointed out that it is also possible to embed the semiconductor chip into a potting compound with scattering particles and to add absorber into the potting compound, without applying a covering layer. The addition of absorber has the disadvantage, however, that in the case of an increased proportion of scattering particles, the absorber concentration must also be high in order to achieve the same contrast. However, a higher absorber concentration also leads to an increased absorption of the light emitted by the semiconductor chip. This interaction can be eliminated by the separation into an encapsulation with scattering particles and an absorbent covering layer, as described in the previous exemplary embodiments.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

What is claimed is:

1. An optoelectronic semiconductor component comprising:

a basic body;

a semiconductor chip arranged over the basic body;

an encapsulation embedding the semiconductor chip, the encapsulation comprising a radiation-transmissive material with scattering particles; and a radiation-transmissive covering layer with an absorber overlying the encapsulation;

wherein the scattering particles and the absorber are separated so that scattering particle density has no influence on absorption effect, wherein the basic body has a step in an inner area, wherein a filling level of the encapsulation in a cutout of the basic body terminates with the step and wherein the filling level of the covering layer applied to the encapsulation terminates with a surface of the basic body, wherein a horizontal extent of the covering layer is greater than a horizontal area of the encapsulation that terminates at the step, and wherein the filling level of the encapsulation in the cutout of the basic body terminates with a wave in an inner area and, wherein the filling level of the covering layer applied to the encapsulation terminates with the surface of the basic body.

2. The optoelectronic component according to claim 1, wherein the horizontal extent of the covering layer is greater than the horizontal area of the encapsulation that terminates at the wave and wherein in a vertical direction, the filling level begins in an edge region of the covering layer below the encapsulation.

3. An optoelectronic semiconductor component comprising:

a basic body;

a semiconductor chip arranged over the basic body;

an encapsulant embedding the semiconductor chip, the encapsulant comprising a radiation-transmissive material with scattering particles; and a radiation-transmissive covering layer with an absorber overlying the encapsulant;

wherein the basic body has a step in an inner area, wherein a filling level of the encapsulant in a cutout of the basic body terminates with the step and wherein a filling level of the covering layer applied to the encapsulant terminates with a surface of the basic body, wherein a horizontal extent of the covering layer is greater than a horizontal area of the encapsulant that terminates at the step, and wherein the filling level of the encapsulant in the cutout of the basic body terminates with a wave in the inner area.

4. The optoelectronic component according to claim 3, wherein the basic body comprises a material which is at least partly absorbent for a radiation emitted by the semiconductor chip.

5. The optoelectronic component according to claim 3, wherein the absorber in the covering layer is absorbent for externally incident extraneous light.

6. The optoelectronic component according to claim 3, wherein the basic body comprises a leadframe around which a plastic material is injection-molded, the basic body having a cutout at a top side.

7. The optoelectronic component according to claim 3, wherein the basic body comprises a substrate.

8. The optoelectronic component according to claim 3, wherein the covering layer comprises epoxy resin and the absorber comprises carbon black.

9. The optoelectronic component according to claim 3, wherein the covering layer comprises silicone and the absorber comprises carbon black.

10. The optoelectronic component according to claim 3, wherein the covering layer comprises silicone-epoxide hybrid and the absorber comprises carbon black.

11. The optoelectronic component according to claim 3, wherein the covering layer is a lamina that is adhesively bonded onto the encapsulation.

12. The optoelectronic component according to claim 3, wherein the filling level of the covering layer applied to the encapsulation terminates with the surface of the basic body.

13. The optoelectronic component according to claim 12, wherein the horizontal extent of the covering layer is greater than the horizontal area of the encapsulation that terminates at the wave and wherein in a vertical direction, the filling level begins in an edge region of the covering layer below the encapsulation.

14. The optoelectronic component according to claim 3, wherein the scattering particles are arranged in the encapsulation but not in the covering layer and wherein the absorber is arranged in the covering layer but not in the encapsulation.

* * * * *